(12) United States Patent
Saeki et al.

(10) Patent No.: US 10,249,704 B2
(45) Date of Patent: Apr. 2, 2019

(54) CAPACITOR

(71) Applicant: Murata Manufacturing Co., Ltd., Nagaokakyo-shi, Kyoto-fu (JP)

(72) Inventors: Hiromasa Saeki, Nagaokakyo (JP); Naoki Iwaji, Nagaokakyo (JP); Hiroshi Nakagawa, Nagaokakyo (JP); Junichi Yoshida, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 27 days.

(21) Appl. No.: 15/228,093

(22) Filed: Aug. 4, 2016

(65) Prior Publication Data
US 2017/0047165 A1 Feb. 16, 2017

(30) Foreign Application Priority Data

Aug. 11, 2015 (JP) ................. 2015-159139

(51) Int. Cl.
| | |
|---|---|
| *H01G 4/08* | (2006.01) |
| *H01G 4/33* | (2006.01) |
| *H01G 4/008* | (2006.01) |
| *H01L 49/02* | (2006.01) |

(52) U.S. Cl.
CPC .............. *H01L 28/60* (2013.01); *H01G 4/008* (2013.01); *H01G 4/085* (2013.01); *H01G 4/33* (2013.01); *H01L 28/82* (2013.01)

(58) Field of Classification Search
CPC ......... H01L 28/60; H01L 28/82; H01G 4/008; H01G 4/085; H01G 4/33
USPC .......................................... 361/305
See application file for complete search history.

(56) References Cited

U.S. PATENT DOCUMENTS

| | | | |
|---|---|---|---|
| 8,440,537 B1 * | 5/2013 | Malhotra | H01L 28/60 257/303 |
| 2005/0014060 A1 * | 1/2005 | Suzuki | H01M 4/8605 429/482 |
| 2011/0020603 A1 * | 1/2011 | Kunishi | H01G 9/0032 428/141 |
| 2014/0226260 A1 * | 8/2014 | Gardner | H01G 11/56 361/502 |

OTHER PUBLICATIONS

G. Fiorentino et al.; "Impact of the atomic layer deposition precursors diffusiion on solid-state carbon nanotube based supercapacitors performanoes"; IOP Publishing, Nanotechnology 26 (2015), pp 1-11.

* cited by examiner

*Primary Examiner* — Michael P McFadden
(74) *Attorney, Agent, or Firm* — Arent Fox LLP

(57) ABSTRACT

A capacitor that includes a conductive porous base material with a porous part; an upper electrode opposite the porous part, the upper electrode having, as its main constituent, a material selected from one of ruthenium, platinum, and an alloy of ruthenium and platinum; and a dielectric layer between the upper electrode and the conductive porous base material.

19 Claims, 2 Drawing Sheets

CAPACITOR

CROSS REFERENCE TO RELATED APPLICATIONS

The present application claims priority to Japanese Patent Application No. 2015-159139, filed Aug. 11, 2015, the entire contents which is incorporated herein by reference.

BACKGROUND OF THE INVENTION

1. Field of the Invention

The present invention relates to a capacitor.

2. Description of the Related Art

In recent years, with higher-density mounting of electronic devices, capacitors with higher electrostatic capacitance have been required. As such a capacitor, for example, Nanotechnology 26 (2015) 064002 discloses therein a capacitor that has an $Al_2O_3$ layer as a dielectric layer and a TiN layer as an upper electrode formed on a porous body composed of a carbon nanotube with the use of an atomic layer deposition method (ALD method: Atomic Layer Deposition).

SUMMARY OF THE INVENTION

In Nanotechnology 26 (2015) 064002, the TiN layer as an upper electrode is formed by an ALD method with the use of a $TiCl_4$ gas and a $NH_3$ gas. However, the inventors have found that the use of the TiN layer as an upper electrode has the following problems:

(1) the TiN layer is gradually oxidized in contact with oxygen in the atmosphere, thereby decreasing the conductivity; (2) when the TiN layer is formed by an ALD method, there is a possibility that chlorine atoms derived from the raw material (for example, $TiCl_4$) will remain in the TiN layer, thereby corroding the dielectric layer or the conductive porous base material under the influence of the residual chlorine; (3) the TiN layer has poor plating (for example, copper plating) attachment; and (4) in the case of forming the TiN layer by an ALD method, the use of a reducing gas has the possibility of taking oxygen away from the other layer composed of the oxide, and thus decreasing the performance due to deficient oxygen.

An object of the present invention is to provide a capacitor including a conductive porous base material, a dielectric layer located on the conductive porous base material, and an upper electrode located on the dielectric layer, where the upper electrode has a high environmental tolerance, the conductive porous base material and the dielectric layer have functions retained sufficiently, and the upper electrode further has favorable plating attachment.

The inventors have found, as a result of earnestly carrying out studies in order to solve the problems mentioned above, that the use of a ruthenium (Ru) electrode or a platinum (Pt) electrode as an upper electrode can solve the problems, thereby achieving the present invention.

According to an aspect of the present invention, a capacitor is provided which includes a conductive porous base material with a porous part; an upper electrode opposite the porous part, the upper electrode comprising a material selected from the group consisting of ruthenium and platinum; and a dielectric layer between the upper electrode and the conductive porous base material.

According to the present invention, a capacitor including a conductive porous base material, an upper electrode that is a Ru electrode or a Pt electrode, and a dielectric layer between the upper electrode and the conductive base material can suppress a decrease of conductivity by oxidation, reduce the amount of residual chlorine, and make the other layers (for example, the dielectric layer) unlikely to be adversely affected. In addition, this capacitor has, when plating is applied onto the upper electrode, high adhesion between the upper electrode and the plating, thereby making defects unlikely to be caused by peeling of the plating. As a result, a highly reliable capacitor can be provided.

DETAILED DESCRIPTION OF PREFERRED EMBODIMENTS OF THE INVENTION

Capacitors according to the present invention will be described in detail below with reference to the drawings. However, the capacitor according to the present embodiment and the shapes and arrangement of respective constructional elements are not limited to the examples shown in the figures.

Figure 1:
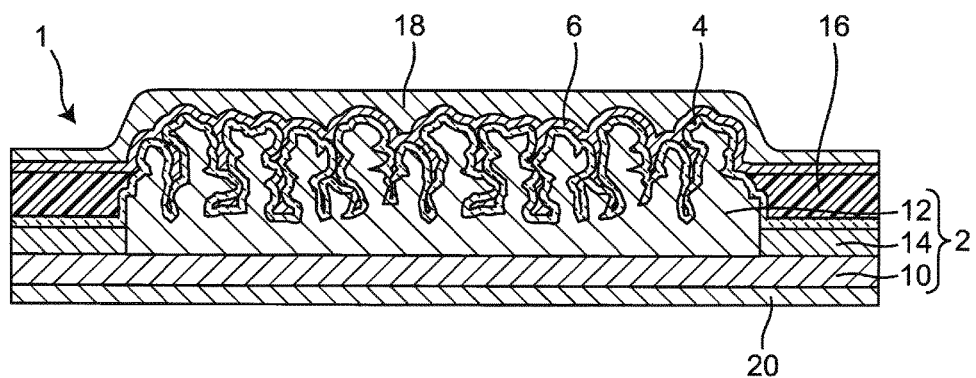
FIG. 1 is a schematic cross-sectional view of a capacitor 1 according to an embodiment of the present invention.
Figure 2:
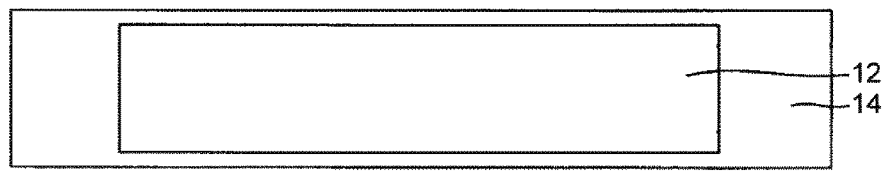
FIG. 2 is a schematic plan view of a conductive metallic substrate of the capacitor 1 shown in FIG. 1.
Figure 3:
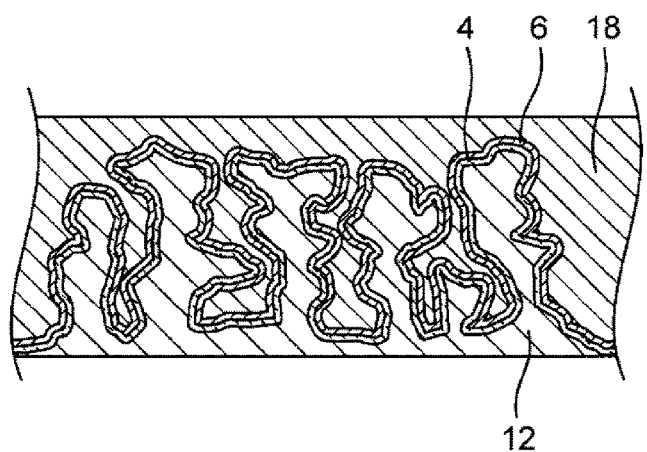
FIG. 3 is a schematic cross-sectional view of a high-porosity part of the capacitor 1 shown in FIG. 1.
Figure 4:
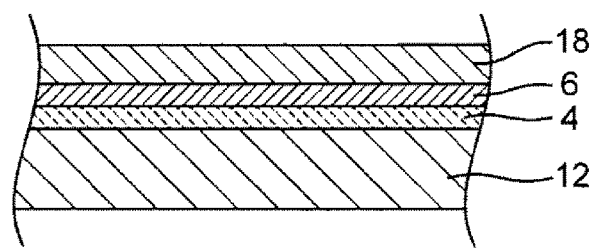
FIG. 4 is a diagram schematically illustrating a layered structure in the high-porosity part of the capacitor 1 shown in FIG. 1.

FIG. 1 shows a schematic cross-sectional view of a capacitor 1 according to the present embodiment, and FIG. 2 shows a schematic plan view of a conductive porous base material 2. In addition, FIG. 3 shows an enlarged view of a high-porosity part 12 of a conductive porous base material 2, and FIG. 4 schematically shows a layered structure of the high-porosity part 12, a dielectric layer 4, an upper electrode 6, and a first external electrode 18.

As shown in FIGS. 1, 2, 3, and 4, the capacitor 1 according to the present embodiment has a substantially cuboid shape, and schematically has the conductive porous base material 2, the dielectric layer 4 formed on the conductive porous base material 2, and the upper electrode 6 formed on the dielectric layer 4. The conductive porous base material 2 has, at one principal surface (first principal surface) side, a high-porosity part 12 that is relatively higher in porosity, and a low-porosity part 14 that is relatively lower in porosity. The high-porosity part 12 is centrally located at a first principal surface of the conductive porous base material 2, and the low-porosity part 14 is located around the high-porosity part. More specifically, the low-porosity part 14 surrounds the high-porosity part 12. The high-porosity part 12 has a porous structure, that is, corresponding to the porous part according to the present invention. In addition, the conductive porous base material 2 has a supporting part 10 at the other principal surface (second principal surface) side. More specifically, the high-porosity part 12 and the low-porosity part 14 constitute the first principal surface of the conductive porous base material 2, whereas the supporting part 10 constitutes the second principal surface of the conductive porous base material 2.

In FIG. 1, the first principal surface serves as the upper surface of the conductive porous base material 2, whereas the second principal surface serves as the lower surface of the conductive porous base material 2. At an end part of the capacitor 1, there is an insulating part 16 between the dielectric layer 4 and the upper electrode 6. The capacitor 1 includes the first external electrode 18 on the upper electrode 6, and a second external electrode 20 on the principal surface of the conductive porous base material 2 closer to the supporting part 10. In the capacitor 1 according to the present embodiment, the first external electrode 18 is electrically connected to the upper electrode 6, and the second external electrode 20 is closely attached to the second principal surface of the conductive porous base material 2. The upper electrode 6 and the high-porosity part 12 of the conductive porous base material 2 are disposed to be opposed to each other with the dielectric layer 4 interposed therebetween, thereby constituting an electrostatic capacitance formation part. When current is applied to the upper electrode 6 and the conductive porous base material 2, charges can be accumulated in the dielectric layer 4.

The conductive porous base material 2 has a porous structure, and the material and composition thereof are not limited as long as the surface is conductive. Examples of the conductive porous base material include, for example, a porous metallic base material, or a base material with a conductive layer formed on the surface of a porous silica material, a porous carbon material, or a porous ceramic sintered body. In a preferred embodiment, the conductive porous base material is a porous metallic base material.

Examples of the metal constituting the porous metallic base material include, for example, metals such as aluminum, tantalum, nickel, copper, titanium, niobium, and iron, and alloys such as stainless steel and duralumin. In an embodiment, the porous metallic base material can be an aluminum or nickel porous base material, in particular, an aluminum porous base material.

The conductive porous base material 2 has the high-porosity part 12 and the low-porosity part 14 at one principal surface (first principal surface) side, and the supporting part 10 at the other principal surface (second principal surface) side.

The term "porosity" in this specification refers to the proportion of voids in the conductive porous base material. The porosity can be measured in the following way. It is to be noted that while voids of the porous part mentioned above can be filled finally with the dielectric layer, the upper electrode, and the like in the process of preparing the capacitor, the "porosity" is calculated with filled sites also regarded as voids, without considering the substances filling as just described.

First, a porous metallic base material is processed by a FIB (Focused Ion Beam) micro-sampling method into a thin section sample of 60 nm or less in thickness. A predetermined region (3 µm×3 µm) of the thin section sample in a cross section of the sample is subjected to measurement by STEM (Scanning Transmission Electron Microscope)-EDS (Energy Dispersive X-ray Spectrometry) mapping analysis. The area of the porous metallic base material with the metal present is figured out in the visual field of the mapping analysis. Then, the porosity can be calculated from the following equality. This measurement is made at any three locations, and the average value for the measurement values is regarded as a porosity.

Porosity (%)=((Measured Area−Area of Base Material with Metal Present)/Measured Area)×100

In this specification, the term "high-porosity part" means a part that is higher in porosity than the supporting part and low-porosity part of the conductive porous base material, and corresponds to the porous part of the present invention.

The high-porosity part 12 has a porous structure. The high-porosity part 12 with the porous structure increases the specific surface area of the conductive porous base material, and further increases the capacitance of the capacitor.

The porosity of the high-porosity part can be preferably 20% or more, more preferably 30% or more, and further preferably 35% or more from the perspective of increasing the specific surface area, and further increasing the capacitance of the capacitor. In addition, from the perspective of ensuring the mechanical strength, the porosity is preferably 90% or less, and more preferably 80% or less.

The high-porosity part is not particularly limited, but preferably has an expanded surface ratio of 30 times or more and 10,000 times or less, more preferably 50 times or more and 5,000 times or less, for example, 200 times or more and 600 times or less. In this regard, the expanded surface ratio refers to the ratio of the surface area per unit projected area. The surface area per unit projected area can be obtained from the amount of nitrogen adsorption at a liquid nitrogen temperature with the use of a BET specific surface area measurement system.

The term "low-porosity part" in this specification means a part that is lower in porosity as compared with the high-porosity part. Preferably, the porosity of the low-porosity part is lower than the porosity of the high-porosity part, and higher than the porosity of the supporting part.

The porosity of the low-porosity part is preferably 20% or less, more preferably 10% or less. In addition, the low-porosity part may have a porosity of 0%. More specifically, the low-porosity part may have a porous structure, and there is no need to have any porous structure. The mechanical strength of the capacitor is improved as the porosity of the low-porosity part is lower.

It is to be noted that the low-porosity part is not an essential constituent element, or do not have to be present. For example, the supporting part 10 may be exposed to above without the low-porosity part 14 in FIG. 1.

Although the conductive porous material is composed of the high-porosity part and the low-porosity part present around the high-porosity part at one principal surface in the present embodiment, the present invention is not limited thereto. More specifically, the high-porosity part and the low-porosity part are not particularly limited in terms of presence location, the number of parts located, size, shape, the ratio between both the high-porosity part and the low-porosity part, and the like.

For example, one principal surface of the conductive porous base material may be composed of only the high-porosity part. In addition, the both principal surfaces of the conductive porous base material may have the high-porosity part. The capacitance of the capacitor can be controlled by adjusting the ratio between the high-porosity part and the low-porosity part.

The thickness of the high-porosity part 12 is not particularly limited, but can be appropriately selected for any purpose, and may be, for example, 10 µm or more, and preferably 30 µm or more, and preferably 1000 µm or less, and more preferably 300 µm or less, for example, 50 µm or less.

The porosity of the supporting part of the conductive porous base material is preferably low for fulfilling the function as the supporting part, specifically, preferably 10% or less, and more preferably, there is substantially no void in the supporting part.

The thickness of the supporting part 10 is not particularly limited, but is preferably 10 µm or more, and can be, for example, 30 µm or more, 50 µm or more, or 100 µm or more in order to increase the mechanical strength of the capacitor. In addition, from the perspective of achieving a lower-profile capacitor, the thickness is preferably 1000 µm or less, and can be, for example, 500 µm or less or 100 µm or less.

The thickness of the conductive porous base material 2 is not particularly limited, but can be appropriately selected for any purpose, and may be, for example, 20 µm or more, and preferably 30 µm or more, and for example, 1000 µm or less, preferably 100 µm or less, more preferably 70 µm or less, and further preferably 50 µm or less.

The method for manufacturing the conductive porous base material 2 is not particularly limited. For example, the conductive porous base material 2 can be manufactured in a way that an appropriate metallic material is processed by a method of forming a porous structure, a method of filling a porous structure, or a method of removing a porous structure part, or a combined method thereof.

The metallic material for manufacturing the conductive porous base material can be a porous metallic material (for example, etched foil) or a metallic material (for example, metallic foil) without any porous structure, or a combined material thereof. The method for the combination is not particularly limited, and examples thereof include, for example, a method of attaching by welding or with a conductive adhesive material or the like.

The method for forming the porous structure is not particularly limited, and preferred example thereof include, for example, etching, for example, alternating-current etching. As mentioned below, the conductive porous base material according to the present invention has the conductive material layer at the second principal surface, and thus can prevent capacitor defects such as short circuits even when the base material has through holes produced by etching. Accordingly, the conductive porous base material for use in the present invention can be manufactured by etching with the use of a thinner material.

The method for filling the porous structure is not particularly limited, and examples thereof include, for example, a method of melting the metal by laser irradiation or the like, thereby filling pores, or a method of compressing by mold processing or press working, thereby filling pores. The laser mentioned above is not particularly limited, and examples thereof include a $CO_2$ laser, a YAG laser, and an excimer laser, as well as all-solid-state pulsed lasers such as a femtosecond laser, a picosecond laser, and a nanosecond laser. The all-solid-state pulsed lasers such as a femtosecond laser, a picosecond laser, and a nanosecond laser are preferred because the shape and the porosity can be controlled with more precision.

The method for removing a part of the porous structure part is not particularly limited, and examples thereof include dicer processing and laser abrasion processing.

In a method, the conductive porous base material 2 can be manufactured by preparing a porous metallic material, and filling holes at sites corresponding to the supporting part 10 and low-porosity part 14 of the porous metallic base material.

There is no need to form the supporting part 10 and the low-porosity part 14 at the same time, which may be formed separately. For example, first, the site corresponding to the supporting part 10 of the porous metallic base material may be processed to form the supporting part 10, and then, the site corresponding to the low-porosity part 14 may be processed to form the low-porosity part 14.

In another method, the conductive porous base material 2 can be manufactured by processing a site of a metallic base material (for example, metallic foil) without any porous structure, which corresponds to the high-porosity part, thereby forming a porous structure.

In the capacitor 1 according to the present embodiment, the dielectric layer 4 is formed on the first principal surface (that is, on the high-porosity part 12 and the low-porosity part 14) of the conductive porous base material 2.

The material that forms the dielectric layer 4 is not particularly limited as long as the material has an insulating property, and preferably, examples thereof include metal oxides such as $AlO_x$ (for example, $Al_2O_3$), $SiO_x$ (for example, $SiO_2$), $AlTiO_x$, $SiTiO_x$, $HfO_x$, $TaO_x$, $ZrO_x$, $HfSiO_x$, $ZrSiO_x$, $TiZrO_x$, $TiZrWO_x$, $TiO_x$, $SrTiO_x$, $PbTiO_x$, $BaTiO_x$, $BaSrTiO_x$, $BaCaTiO_x$, and $SiAlO_x$; metal nitrides such as $AlN_x$, $SiN_x$, and AlScNx; and metal oxynitrides such as $AlO_xN_y$, $SiO_xN_y$, $HfSiO_xN_y$, and $SiC_xO_yN_z$, and $AlO_x$, $SiO_x$, $SiO_xN_y$, and $HfSiO_x$ are preferred. It is to be noted that the formulas mentioned above are merely intended to represent the constitutions of the materials, and are not intended to limit the compositions. More specifically, the x, y, and z attached to O and N may have any value larger than 0, and the respective elements including the metal elements may have any presence proportion.

In an embodiment, the material forming the dielectric layer 4 is $AlO_x$ (typically $Al_2O_3$).

In another embodiment, the material forming the dielectric layer 4 contains Hf or Zr. The dielectric layer containing Hf or Zr makes it easy to form, in a more uniform fashion, an upper electrode layer formed thereon.

In another embodiment, the material forming the dielectric layer 4 is $HfO_x$ (typically $HfO_2$) or $ZrO_x$ (typically $ZrO_2$).

In another embodiment, the dielectric layer 4 can be a nanolaminate including a $HfO_x$ (typically $HfO_2$) layer or a $ZrO_x$ (typically $ZrO_2$) layer. In this regard, the nanolaminate means a layer of multiple laminated layers of 0.5 to 2.0 nm in thickness. A preferred nanolaminate can be a laminated body obtained by alternately laminating a $HfO_x$ layer or $ZrO_x$ layer and another layer (preferably $SiO_x$ (typically $SiO_2$) layer). Preferably, the outermost layer (the layer in contact with the upper electrode) of the nanolaminate can be a layer containing Hf or Zr, for example, a $HfO_x$ layer or a $ZrO_x$ layer. The adoption of the nanolaminate layer for the dielectric layer can further increase the breakdown voltage.

The thickness of the dielectric layer is not particularly limited, but for example, preferably 5 nm or more and 100 nm or less, and more preferably 10 nm or more and 50 nm or less. The adjustment of the thickness of the dielectric layer to 5 nm or more can enhance the insulating property, thereby making it possible to reduce the leakage current. In addition, the adjustment of the thickness of the dielectric layer to 100 nm or less makes it possible to achieve higher electrostatic capacitance.

The dielectric layer is preferably formed by a gas phase method, for example, a vacuum deposition method, a chemical vapor deposition (CVD: Chemical Vapor Deposition) method, a sputtering method, an atomic layer deposition (ALD: Atomic Layer Deposition) method, a pulse laser deposition (PLD: Pulsed Laser Deposition) method, or the like. The ALD method is more preferred because a more homogeneous and denser film can be formed even in fine pores of the porous base material.

In an embodiment, the capacitor according to the present invention may have, on the dielectric layer, an intermediate layer for facilitating uniform layer formation. In a preferred embodiment, the intermediate layer can be, for example, a layer containing Hf or Zr, for example, a $HfO_x$ layer or a $ZrO_x$ layer. The intermediate layer preferably has a thickness of 1 nm or more, more preferably, a thickness of 3 nm or more. Providing the intermediate layer makes it possible to form the upper electrode in a more uniform fashion.

In the capacitor 1 according to the present embodiment, the insulating part 16 is provided on an end part of the dielectric layer 4. Disposing the insulating part 16 can prevent short circuits between the upper electrode 6 disposed on the insulating part and the conductive porous base material 2.

It is to be noted that the insulating part 16 is present over the entire low-porosity part 14 in the present embodiment, but not limited thereto, and may be present only over a part of the low-porosity part 14, or present over the low-porosity part, and even over the high-porosity part.

In addition, the insulating part 16 is located between the dielectric layer 4 and the upper electrode 6 in the present embodiment, but not limited to this location. The insulating part 16 only has to be located between the conductive porous base material 2 and the upper electrode 6, and, for example, may be located between the low-porosity part 14 and the dielectric layer 4.

The material forming the insulating part 16 is not particularly limited as long as the material has an insulating property, and a resin that has heat resistance is preferred in the case of subsequently using an atomic layer deposition method. Various types of glass materials, ceramic materials, polyimide resins, and fluorine-containing resins are preferred as the insulating material forming the insulating part 16.

The thickness of the insulating part 16 is not particularly limited, but is preferably 1 μm or more, and can be, for example, 5 μm or more or 10 μm or more in order to further ensure that end surface discharge is prevented. In addition, from the perspective of achieving a lower-profile capacitor, the thickness is preferably 100 μm or less, and can be, for example, 50 μm or less or 20 μm or less.

It is to be noted that the insulating part 16 is not an essential element in the capacitor according to the present invention, or does not have to be present.

In the capacitor 1 according to the present embodiment, the upper electrode 6 is formed on the dielectric layer 4 and the insulating part 16.

The material constituting the upper electrode 6 contains, as its main constituent, Ru, Pt, or an alloy of Ru and Pt. Ru, Pt, and the alloy of Ru and Pt are unlikely to undergo oxidation, and thus unlikely to undergo a decrease in conductivity even in the case of exposure to air for a long period of time.

In this regard, the term "main constituent" of the upper electrode means a constituent that is most contained in the upper electrode, means, for example, a constituent that is contained at 50 mass % or higher, or means, a constituent that is contained at, in particular, 80 mass % or higher, preferably 90 mass % or more, more preferably 95 mass % or more, yet further preferably 98% or more, for example, 98.0 to 99.8 mass %, or a constituent that is contained substantially at 100%.

The thickness of the upper electrode is not particularly limited, and preferably for example, 3 nm or more, and more preferably 10 nm or more. The adjustment of the thickness of the upper electrode to 3 nm or more can reduce the resistance of the upper electrode itself.

The method for forming the upper electrode is not particularly limited as long as the method can coat the dielectric layer, and examples of the method include, for example, methods such as an atomic layer deposition (ALD) method, a chemical vapor deposition (CVD: Chemical Vapor Deposition) method, plating, bias sputtering, a Sol-Gel method, and conductive polymer filling.

In a preferred embodiment, the upper electrode is formed by an ALD method. In the case of forming a Ru layer as the upper electrode by an ALD method, although not particularly limited, precursors for ruthenium films, for example, Ru(EtCp)$_2$ (bis(ethylcyclopentadienyl) ruthenium) and oxygen, or ToRuS (from AirLiquide) and hydrogen can be used as raw materials. In the case of forming a Pt layer as the upper electrode by an ALD method, although not particularly limited, for example, precursors for platinum films, for example, MeCpPtMe$_3$ ((trimethyl)methylcyclopentadienyl platinum) and oxygen can be used as raw materials. As just described, the formation of the Ru layer or Pt layer requires no raw material containing chlorine, or requires no reducing raw material, and the Ru layer or the Pt layer can be thus formed without adversely affecting other layers.

It is to be noted that when the upper electrode has insufficient conductivity as a capacitor electrode after the formation of the upper electrode, an extension electrode layer composed of Al, Cu, Ni, or the like may be additionally formed on the surface of the upper electrode by a method such as sputtering, vapor deposition, or plating.

According to the present embodiment, the first external electrode 18 is formed on the upper electrode 6, whereas the second external electrode 20 is formed on the supporting part 10.

The material constituting the first external electrode 18 and the second external electrode 20 is not particularly limited, and example thereof include, for example, metals such as Au, Pb, Pd, Ag, Sn, Ni, and Cu, and alloys, as well as conductive polymers. The method for forming the first external electrodes and the second external electrode 20 is not particularly limited, but for example, a CVD method, electrolytic plating, electroless plating, vapor deposition, sputtering, baking of a conductive paste, and the like can be used, and electrolytic plating, electroless plating, vapor deposition, sputtering, and the like are preferred.

It is to be noted that the first external electrode 18 and the second external electrode 20 are disposed on the entire principal surfaces of the capacitor, but not limited thereto, and can be disposed in any shape and size only on a part of each surface. In addition, the first external electrode 18 and the second external electrode 20 are not essential elements, or do not have to be present. In this case, the upper electrode 6 also functions as the first external electrode, whereas the conductive porous base material 2 also functions as the second external electrode. More specifically, the upper electrode 6 and the conductive porous base material 2 may function as a pair of electrodes. In this case, the upper electrode 6 may function as an anode, whereas the conductive porous base material 2 may function as a cathode. Alternatively, the upper electrode 6 may function as a cathode, whereas the conductive porous base material 2 may function as an anode.

In an embodiment, the first external electrode 18 can be a plated layer, typically a Cu layer formed on the upper electrode 6. The upper electrode of the capacitor according to the present invention is composed of Ru or Pt, and thus favorable in terms of plating attachment, thereby making the first external electrode 18 unlikely to be peeled.

In the present embodiment, the end part (preferably a peripheral part) of the capacitor can be equal to or smaller than a central part, but preferably equal thereto in thickness. The end part has a large number of layers laminated, and easily undergoes a change in thickness due to cutting, and the variation in thickness can be increased. Accordingly, the reduced thickness of the end part can reduce the influence on the overall size (in particular, thickness) of the capacitor.

Although the capacitor has a substantially cuboid shape in the embodiment described above, the present invention is not limited to the shape. The capacitor according to the present invention can be made into any shape, and for example, the planar shape may be circular, elliptical, quadrangular with rounded corners, or the like.

While the capacitor 1 according to the present embodiment has been described above, various modifications can be made to the capacitor according to the present invention.

For example, a layer for enhancing interlayer adhesion, a buffer layer for preventing the diffusion of constituents between the respective layers, or the like may be provided between the respective layers. The intermediate layer preferably has a thickness of 1 nm or more, more preferably, a thickness of 3 nm or more. In addition, the side surface or the like of the capacitor may be provided with a protective layer.

In addition, while the conductive porous base material 2, the dielectric layer 4, the insulating part 16, and the upper electrode 6 are disposed in this order at the end part of the capacitor in the present embodiment, the present invention is not limited to this order. For example, this disposing order is not particularly limited as long as the insulating part 16 is located between the upper electrode 6 and the conductive porous base material 2, and for example, the conductive porous base material 2, the insulating part 16, the dielectric layer 4, and the upper electrode 6 may be disposed in this order.

Furthermore, although the capacitor 1 according to the present embodiment has the upper electrode and the external electrode to reach edges of the capacitor, the present invention is not limited thereto. In an embodiment, the upper electrode (preferably the upper electrode and the first external electrode) is disposed away from edges of the capacitor. This disposition can prevent end surface discharge. More specifically, the upper electrode may not be formed to cover the entire porous part, or the upper electrode may be formed to cover only the high-porosity part.

EXAMPLES

Example 1

Prepared was aluminum etching foil (porosity: approximately 44.0%). Next, an $AlO_x$ film (dielectric layer) of 25 nm in thickness was formed on the aluminum etching foil by an ALD method with the use of a trimethyl aluminum ($Al(CH_3)_3$) gas and a water vapor ($H_2O$) gas as raw materials.

Then, the Ru layer (upper electrode) of approximately 10 nm in thickness was formed on the dielectric layer by an ALD method with the use of bis(ethylcyclopentadienyl) ruthenium ($Ru(EtCp)_2$) and oxygen as raw materials.

Then, a Cu layer of 10 μm in thickness was formed by electroless plating on the two sides of the aluminum etching foil, thereby providing a capacitor according to Example 1.

Example 2

In the same way as in Example 1 except that a Pt layer of approximately 12 nm in thickness, formed with the use of (trimethyl)methylcyclopentadienyl platinum ($MeCpPtMe_3$) and oxygen as raw materials, was adopted for the upper electrode, a capacitor according to Example 2 was obtained.

Comparative Example 1

In the same way as in Example 1 except that a TiN layer of approximately 10 nm in thickness, formed with the use of titanium tetrachloride ($TiCl_4$) and an ammonia gas as raw materials, was adopted for the upper electrode, a capacitor according to Comparative Example 1 was obtained.

Test Example 1—Withstand Voltage Test

The breakdown voltage was measured for the capacitors obtained above according to Examples 1 and 2 and Comparative Example 1. Specifically, between the Cu electrodes formed at the two sides of the capacitor, direct-current voltage was applied by gradually increasing the voltage, and the voltage in the case of the current flowing through the capacitor in excess of 1 mA was regarded as a breakdown voltage. Fifty capacitors were subjected to the test for each sample, and the median values for the samples are shown in Table 1 below.

Test Example 2—Durability Test

For each of Examples 1 and 2 and Comparative Example 1, the equivalent series resistances (ESR; Equivalent Series Resistance) of twenty capacitors were measured at a temperature of 25±2° C., a voltage of 10 mVrms, and a frequency of 1 MHz with the use of an impedance analyzer (from Agilent Technologies: 4294A), and regarded as initial values.

Then, each sample was put in a constant-temperature and constant-humidity bath set under the conditions of temperature: 85° C. and relative humidity: 85% RH, left for 50 hours and 100 hours, and then taken out, and the equivalent series resistance (ESR) of the capacitor was measured in the same way as mentioned above, thereby figuring out the rate of change from the initial value. The twenty capacitors were subjected to the test for each sample, and the average values for the samples are shown in Table 1 below.

TABLE 1

| | Electrode Material | Breakdown Voltage (V) | Change of ESR in Constant-Temperature and Constant-Humidity Shelf Test (%) | |
|---|---|---|---|---|
| | | | 50 hours | 100 hours |
| Example 1 | Ru | 17.6 | +0.12 | +0.18 |
| Example 2 | Pt | 17.2 | −0.02 | +0.25 |
| Comparative Example 1 | TiN | 4.92 | +159 | +521 |

From the foregoing results, it has been confirmed that the breakdown voltage is higher when Ru or Pt is adopted as the upper electrode material than when TiN is adopted as the upper electrode. This is believed to be because, while the present invention is not bound by any theory, the dielectric layer was degraded by chlorine derived from the raw material present in the TiN layer or the ammonia as a raw material.

In addition, it has been confirmed that the change in conductivity is small, that is, there is resistance to environmental burdens, when Ru or Pt is adopted as the upper electrode material than when TiN is adopted as the upper electrode. This is believed to be because, while the present invention is not bound by any theory, the TiN layer was gradually oxidized, thereby decreasing the conductivity.

Test Example 3

On a Si substrate, a dielectric layer was formed in the same way as in Example 1. Then, respectively in the same ways as in Examples 1 and 2 and Comparative Example 1, upper electrodes were formed, and copper plated layers were formed on the upper electrodes.

The surfaces of the respective samples obtained were subjected to cutting in a grid pattern at intervals of 1 mm (such that the number of regions was 100) with a diamond knife.

Then, the formed films were subjected to a tape peeling test. Specifically, an adhesive tape (CELLOTAPE (registered trademark) from Nichiban Co., Ltd.) was attached to the surfaces of the formed films, and whether the films were peeled or not was observed by rapid peeling in a direction perpendicular to the films. The results are shown in Table 2 below. It is to be noted that the adhesive tape used in the tape peeling test has an adhesive strength of 4.01 N/10 mm. It is to be noted that sample number 3 refers to a comparative example.

TABLE 2

| Sample Number | Electrode Material | The number of Films Peeled |
|---|---|---|
| 1 | Ru | 0 |
| 2 | Pt | 0 |
| 3* | TiN | 100 |

No peeled site was able to be confirmed at all in the case of the samples of the same film structures as in Examples 1 and 2. In contrast, the films were peeled in all of the 100 regions in the case of the samples of the same film structure as in Comparative Example 1. In addition, the peeling was caused at the interface between the TiN layer and the plated layer in all cases. From the results just described, it has been confirmed that the adhesion of the copper plating is higher when Ru or Pt is adopted as the upper electrode material than when TiN is adopted as the upper electrode.

Example 4

The same aluminum etching foil with a porosity of 44.0% as in Example 1 and aluminum etching foil with a porosity of 61.5% were prepared, and onto these types of aluminum etching foil, different dielectric layers ($SiO_x$, $HfO_x$, $ZrO_x$, $AlO_x$) were formed by an ALD method. Then, Ru electrode layers were formed on the dielectric layers.

As for the ALD conditions, the deposition temperatures were all adjusted to 250° C., and the numbers of cycles were adjusted to 150 cycles for the dielectric layers, and 300 cycles for the Ru electrode layers.

In addition, the following was used for raw materials for the respective layers.

$SiO_x$ film: tridimethylaminosilane ($SiH[N(CH_3)_2]_3$) gas and ozone;

$HfO_x$ film: tetrakisdimethylamino hafnium ($Hf[N(CH_3)_2]_4$) gas and water vapor;

$ZrO_x$ film: zirconium chloride ($ZrCl_4$) and water vapor;

$AlO_x$ film: the same as in Example 1 (trimethyl aluminum ($Al(CH_3)_3$) gas and water vapor);

Ru film: the same as in Example 1 (bis(ethylcyclopentadienyl) ruthenium ($Ru(EtCp)_2$) and oxygen)

After the formation of the Ru film, the aluminum etching foil was wrapped in an epoxy resin, and polished in the length direction of the foil to expose a cross section of the foil. Thereafter, a site at 30 μm from the foil surface was processed into a thin section for TEM analysis by a FIB micro-sampling method. The thin section was approximately 60 nm in thickness.

The porous metallic surface in the sample of the thin section obtained was subjected to mapping analysis under measurement conditions (electron probe diameter from STEM: approximately 0.2 nm, the amount of probe current: approximately 200 pA, measurement magnification for mapping: 10000 times power (the number of pixels: 512×512 pixels)) with the use of a STEM-EDS measurement system (STEM: JEM-2200FS from JEOL Ltd., EDS detection system: JED-23001 from JEOL Ltd., EDS system: Noran system 7 from Thermo Fisher Scientific K.K.), the thickness of the dielectric layer was randomly measured at 10 points for each sample, and from the average value for the thickness, the dielectric layer thickness was figured out. Next, the path length of the dielectric layer was measured, whereas the length of the distance with Ru present on the dielectric layer was measured, and the ratio therebetween was regarded as the coverage of the Ru electrode. The results are shown in Table 3.

TABLE 3

| Sample Number | Porosity of Aluminum Etching Foil (%) | Dielectric Layer | | Coverage of Ru Electrode (%) |
|---|---|---|---|---|
| | | Material | Average Thickness (nm) | |
| 11 | 44.0 | SiOx | 15.1 | 12.7 |
| 12 | 61.5 | SiOx | 14.7 | 12.1 |
| 13 | 44.0 | AlOx | 21.5 | 78.5 |
| 14 | 61.5 | AlOx | 22.2 | 24.5 |
| 15 | 44.0 | HfOx | 21.5 | 100 |
| 16 | 61.5 | HfOx | 20.7 | 100 |
| 17 | 44.0 | ZrOx | 15.5 | 100 |
| 18 | 61.5 | ZrOx | 16.7 | 100 |

From the foregoing results, it has been confirmed that Ru is able to completely coat the porous metallic surface in the case of sample numbers 15 to 18 with Ru formed on $HfO_x$ and $ZrO_x$. On the other hand, it has been determined that there are some uncoated regions with Ru formed in a spherical shape in the case of sample numbers 11 to 14 with Ru formed on $AlO_x$ and $SiO_x$. This is believed to be caused by the Ru deposition onto $AlO_x$ and $SiO_x$, which has a long incubation period (Incubation period: a period in which the ALD deposition is not initiated, or slow), and thus requires a larger number of cycles until spherical Ru crystals undergo grain growth by the ALD deposition and turn into a film.

Example 5

On aluminum etching foil with a porosity of 44.0%, $SiO_x$ (dielectric layer) was formed by an ALD method. On the dielectric layer, a $HfO_x$ or $ZrO_x$ (intermediate layer) was formed as an intermediate layer, and a Ru film (electrode layer) was further formed. The film thickness of the intermediate layer was varied by adjusting the number of cycles. Next, the thicknesses of the dielectric layer and intermediate layer (averages for 10 points) and the coverage of the Ru electrode were figured out by the same STEM-EDS method as in Example 4. The results are shown in Table 4.

TABLE 4

| Sample Number | Porosity of Aluminum Etching Foil (%) | Average Thickness (nm) | | | Coverage of Ru Electrode (%) |
|---|---|---|---|---|---|
| | | Dielectric Layer SiO$_x$ | Intermediate Layer HfO$_x$ | Intermediate Layer ZrO$_x$ | |
| 21 | 44.0 | 18.2 | 0.8 | — | 76.4 |
| 22 | 44.0 | 17.5 | 4.5 | — | 100 |
| 23 | 44.0 | 18.1 | 13.3 | — | 100 |
| 24 | 44.0 | 17.1 | — | 0.9 | 65.4 |
| 25 | 44.0 | 17.9 | — | 3.3 | 100 |
| 26 | 44.0 | 17.5 | — | 7.5 | 100 |

From the foregoing results, the Ru coverage is decreased as the film thickness of HfO$_x$ or ZrO$_x$ is smaller, and Ru is not able to completely coat the HfO$_x$ or ZrO$_x$ film below approximately 1 nm in thickness.

Example 6

Aluminum etching foil with a porosity of 44.0% was prepared, and on each sheet of foil, a dielectric layer of HfO$_x$ or ZrO$_x$ was deposited by an ALD method for a thickness of approximately 25 nm. In addition, separately, nanolaminates of approximately 25 nm in thickness were formed by alternately laminating one of HfO$_x$ and ZrO$_x$, and SiO$_x$, each for approximately 1.5 nm in thickness, and adopted as dielectric layers. It is to be noted that the layer in contact with a Ru layer (the layer formed last) was one of HfO$_x$ and ZrO$_x$. Then, an electrode layer of Ru was deposited on top of the dielectric layers.

After the formation of the Ru electrodes, Cu of approximately 10 μm in thickness was deposited by an electroless plating method onto the two sides of the aluminum etching foil, thereby preparing capacitors. For each of the capacitors obtained, the breakdown voltage was measured in the same way as in Test Example 1. The results are shown in the following table.

TABLE 5

| Sample Number | Dielectric Layer | | Electrode | | | Breakdown Voltage (V) |
|---|---|---|---|---|---|---|
| | Composition | Average Thickness (nm) | Material | Average Thickness (nm) | Coverage of Ru Electrode (%) | |
| 31 | HfOx | 24.5 | Ru | 32.5 | 100 | 6.7 |
| 32 | ZrOx | 24.7 | | 35.7 | 100 | 7.2 |
| 33 | HfOx + SiOx | 25.3 | | 34.6 | 100 | 16.3 |
| 34 | ZrOx + SiOx | 25.6 | | 31.8 | 100 | 16.1 |

The insulating property was greater when the nanolaminate of: one of HfO$_x$ and ZrO$_x$; and SiO$_x$ was adopted for the dielectric layer than in the case of the dielectric layer of HfO$_x$ or ZrO$_x$ alone. More specifically, as long as the dielectric contains one of Hf and Zr in the range of 1 nm in thickness near the interface in contact with the Ru electrode, it is not always necessary for the dielectric to be a layer of single composition, but capacitors which have excellent insulating properties can be prepared through the use of a structure that has compositions controlled alternately.

The capacitor according to the present invention is, because of its remarkable stability and high reliability, used for various electronic devices in a preferred manner.

What is claimed is:

1. A capacitor comprising:
   a conductive porous base material with a porous part having a plurality of pores;
   an upper electrode opposite the porous part, the upper electrode comprising, as a main constituent thereof, a material selected from the group consisting of ruthenium, platinum, and an alloy of ruthenium and platinum; and
   a dielectric layer between the upper electrode and the conductive porous base material,
   wherein the upper electrode and the dielectric layer extend into the plurality of pores of the porous part.

2. The capacitor according to claim 1, wherein the material of the upper electrode is ruthenium.

3. The capacitor according to claim 2, further comprising a metallic layer on the upper electrode.

4. The capacitor according to claim 3, wherein the metallic layer is a copper layer.

5. The capacitor according to claim 3, wherein the metallic layer is a plating layer.

6. The capacitor according to claim 1, further comprising a metallic layer on the upper electrode.

7. The capacitor according to claim 6, wherein the metallic layer is a copper layer.

8. The capacitor according to claim 6, wherein the metallic layer is a plating layer.

9. The capacitor according to claim 1, wherein the dielectric layer comprises at least one of Hf and Zr.

10. The capacitor according to claim 1, wherein the dielectric layer is a nanolaminate comprising a first layer containing at least one of Hf and Zr and a second layer containing a second element.

11. The capacitor according to claim 10, wherein the second element is one or Si and Al.

12. The capacitor according to claim 1, further comprising an intermediate layer containing at least one of Hf and Zr between the dielectric layer and the upper electrode.

13. The capacitor according to claim 12, wherein the dielectric layer is a nanolaminate comprising a first layer containing at least one of Hf and Zr and a second layer containing a second element.

14. The capacitor according to claim 13, wherein the second element is one of Si and Al.

15. The capacitor according to claim 12, wherein the intermediate layer is 1 nm or more in thickness.

16. The capacitor according to claim 1, wherein the conductive porous base material comprises a material containing one of aluminum and nickel.

17. The capacitor according to claim 1, wherein the upper electrode is an atomic deposition layer.

18. The capacitor according to claim 1, wherein the material of the upper electrode is platinum.

19. The capacitor according to claim 1, wherein the material of the upper electrode is an alloy of ruthenium and platinum.

\* \* \* \* \*